United States Patent

Zung

[11] Patent Number: 5,911,850
[45] Date of Patent: Jun. 15, 1999

[54] SEPARATION OF DICED WAFERS

[75] Inventor: Michael Zung, San Jose, Calif.

[73] Assignee: International Business Machines Corporation, Armonk, N.Y.

[21] Appl. No.: 08/879,543

[22] Filed: Jun. 20, 1997

[51] Int. Cl.$^6$ .................................................. B32B 35/00
[52] U.S. Cl. ......................... 156/344; 156/584; 438/464
[58] Field of Search .................................. 156/344, 584; 438/464; 29/426.5, 426.1, 426.3

[56] References Cited

U.S. PATENT DOCUMENTS 4,590,667  5/1986  Simon ........................................ 29/589

FOREIGN PATENT DOCUMENTS

| 62-128139 | 6/1987 | Japan | 156/584 |
| 62-293737 | 12/1987 | Japan | 156/344 |
| 63-29946 | 2/1988 | Japan | 156/344 |
| 64-68938 | 3/1989 | Japan | 156/344 |
| 3-22458 | 1/1991 | Japan | 156/344 |

*Primary Examiner*—Mark A. Osele
*Attorney, Agent, or Firm*—John H. Holcombe

[57] ABSTRACT

A method and tool are disclosed for separating a diced magnetic disk file slider from a tape to be removed by a picker. The diced slider is adhesively mounted on a wafer tape, at its attachment surface, with the air bearing surface away from the tape. The tape is positioned in a first plane, and a pushing device is projected into the tape near the leading edge of the slider to push the tape and the slider into a second plane at an angle away from the first plane. The pushing device is moved along the tape toward the trailing edge of the slider to cause the taut tape to peel from the mounted slider. A vacuum picker adjacent the tape engages the slider at the air bearing surface and removes the slider from the tape as the tape is peeled from the slider. A row of sliders may be separated by a corresponding row of pushers.

19 Claims, 3 Drawing Sheets

SEPARATION OF DICED WAFERS

FIELD OF THE INVENTION

This invention relates to wafer processing, and, more particularly, to separating a die or dice, such as sliders for use in magnetic disk drives.

BACKGROUND OF THE INVENTION

The processing of diced wafers, for example, magnetic disk file sliders, by transporting the dice mounted on a wafer dicing tape, provides many benefits in view of the reduced sizes of the sliders having improved technology. Wafer dicing tape, typically referred to as "tape", is a tape with high toughness, such as wide polyvinyl chloride membrane, with adhesive applied to one side, mounted in a frame. Rows of sliders mounted on the tape are held securely in position with great accuracy for cleaning, inspecting, processing, parting, and sorting. Slider and row verification is reduced to a minimum in that, once a die is mounted on the tape, it is not likely to be inadvertently moved around or repositioned during processing.

In order to be workable and avoid inadvertent repositioning of the sliders, the adhesive must be strong. However, when removing a slider from the tape with a removal tool such as a vacuum picker, the force from the vacuum picker is not adequate to overcome the adhesive holding force of the tape.

One prior art approach used to remove a slider attached to a tape includes positioning a needle directly under the slider. More specifically, the needle is instantaneously pushed up into the tape, potentially puncturing the tape, to lift the slider from the tape. Expensive controls are required to limit tape puncture. The needle can transfer a small amount of tape adhesive to the attachment side of the slider if it punctures the tape. The transferred adhesive in itself is a contaminant on the slider. Because of the nature of adhesives, the transferred adhesive can also attach other contaminants to the slider. In addition, the adhesive can also free itself from the slider and contaminate other parts in subsequent operations and processes as well as the finished product.

Another prior art approach includes heating the tape to reduce the strength of the adhesive to allow removal of the sliders by a picker. This approach has proven to be inconsistent in providing clean sliders, because heating the adhesive does not assure that the adhesion between the slider and the adhesive is the first to weaken.

A third prior art approach described in U.S. Pat. No. 4,590,667 of Simon, describes a knife edge for presenting a row of semiconductor devices such as LED's, mounted on a non-elastic membrane with an ultra-violet sensitive adhesive, to a vacuum fixture. An ultra-violet light is flashed to facilitate lifting the devices from the membrane as they pass over the knife edge. The vacuum fixture may be provided with a lip to engage the row of devices to "slide" the entire row off the membrane as the membrane is moved across the knife edge.

The use of an ultra-violet sensitive adhesive and flashing an ultra-violet light for separating sliders from a tape, like heating the adhesive, above, would not assure that the adhesion between the slider and the adhesive is the first to deteriorate. Instead, the adhesion between the adhesive and tape may be the first to deteriorate. It is likely that some of the adhesive will remain attached to, and contaminate, the slider.

Furthermore by engaging the sliders with a lip while the tape is moving requires the entire row of devices to be removed at once. Selective device removal from the membrane is not possible using this method.

SUMMARY OF THE INVENTION

An object of the present invention is to remove sliders from a dicing tape easily and without contamination.

A method and tool for separating a die, or a row of dice, from a tape is described. For one embodiment, diced sliders may be removed from a tape for further processing.

In the method, the diced sliders are received adhesively mounted on a taut flexible membrane, or wafer tape, at their attachment surface, and with the air bearing surface away from the tape. The tape is positioned in a first plane, and held taut. A pusher is projected into the tape near the leading edge of a slider, to extend the tape and the slider in a second plane at an angle away from the first plane. As the pusher engages the leading edge of the slider, the pusher positions the slider parallel to the vacuum picker. The pusher is slid along the tape toward the trailing edge of the sliders to cause the taut tape to peel from the mounted slider. A vacuum picker adjacent the tape engages the slider at the air bearing surface and picks the slider as the tape is peeled from the slider. A row of sliders may be separated by a corresponding row of pushers.

The tool for separating a die or row of dice from the tape comprises a wafer tape support for supporting the tape in a first plane. A picker, such as a vacuum picker, is positioned adjacent the tape for engaging the dice, and a pusher is provided projecting into the first plane of the membrane at the leading edge of the die, extending the tape and die in a second plane at an angle away from the first plane. The pusher is moveable from an initial position at the leading edge to a position at the trailing edge of the die so that the tape is peeled from the die to separate the die from the tape.

Other objects, features, and advantages of the present invention will be apparent from the accompanying drawings and from the detailed description below.

BRIEF DESCRIPTION OF THE DRAWINGS

The present invention is illustrated by way of example and not limitation in the figures by the accompanying drawings in which like references indicate similar elements and in which.

DETAILED DESCRIPTION OF THE INVENTION

Figure 1:
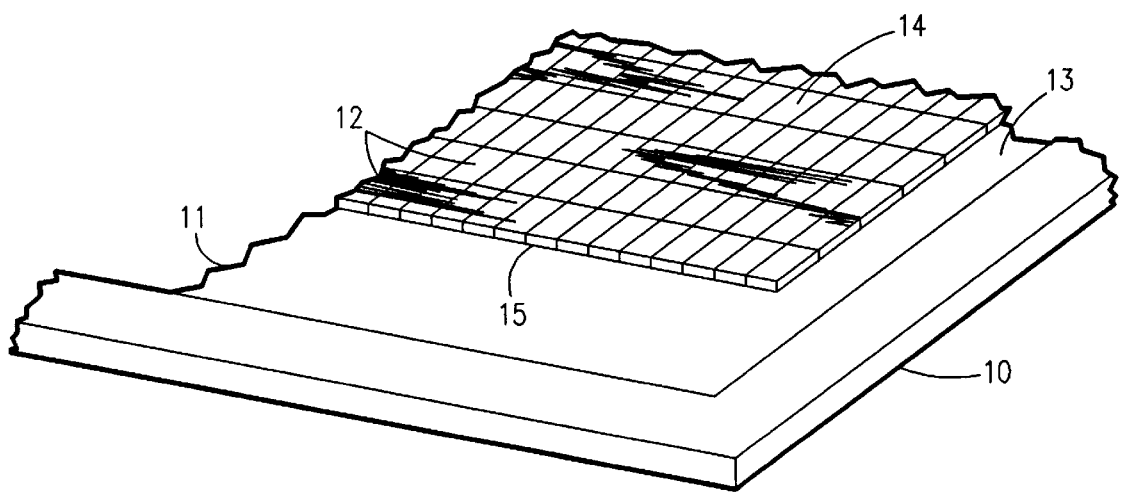
FIG. 1 is a perspective representation of a frame supporting a wafer tape with a plurality of sliders to be separated in accordance with the present invention.

FIG. 1 illustrates one embodiment of a frame 10 that supports a flexible membrane 11, also called "wafer dicing tape". The tape to be used in this application is simply one with a high toughness that can sustain a localized deformation. Mounted on the wafer dicing tape are a plurality of dice. For one embodiment, each die may be a slider for use in a magnetic disk drive. The wafer dicing tape 11 is a wide polyvinyl chloride membrane with adhesive applied to one side 13. The wafer dicing tape 11 may include various other types of adhesive tapes that have the ability to stretch. The frame 10 holds the wafer dicing tape taut at the ends in at least one direction. In other words, the tape is drawn tight to eliminate slack within the tape. In an alternative arrangement, the wafer dicing tape may comprise a ring, holding the tape area taut.

The sliders 12 are shown in enlarged form and may be arranged in a single column or row or in a column of diced rows, as illustrated. The sliders comprise ceramic dice on which are mounted magnetic transducers for reading and/or writing data stored on magnetic disks. One surface 14 of each slider is an air bearing surface which is precisely formed to fly on an air bearing over a magnetic recording disk. The opposite surface 15 of each slider is a suspension attachment surface to which a suspension attaches the slider to the disk drive.

The attachment surface 15 of the sliders 12 are mounted on the adhesive surface 13 of the wafer dicing tape 11 and a held securely by the adhesive. The sliders are held securely in position with great accuracy for cleaning, inspecting, processing, parting and sorting. Slider and row verification is reduced to a minimum in that once a row is placed onto the wafer dicing tape 11, it cannot be inadvertently repositioned or exchanged with another row during processing.

As an example, the frame 10 may be 6 inches in length or in diameter and support 24 rows of 44 sliders each, with the tape 11 held at the perimeter by means of the adhesive 13.

The adhesive 13 is required to be strong to assure secure mounting of the sliders 12, and becomes an obstacle when the sliders are to be removed from the tape 11 by prior art tools. The typical vacuum picker for removing the sliders from the tape may have insufficient vacuum force to pull the sliders directly from the tape, and attempting to push or slide the mounted sliders is likely to tear some of the adhesive from the tape, leaving adhesive deposits on the surface 15 of the slider.

The prior art system discussed above, for puncturing the tape with needles, also may have the likely result of leaving contaminating adhesive on the sliders. Because of the nature of adhesives, the adhesive on a slider can attach other contaminants to the slider. The adhesive can also free itself from the slider and contaminate other parts in subsequent operations and processes as well as the finished product.

Figure 2:
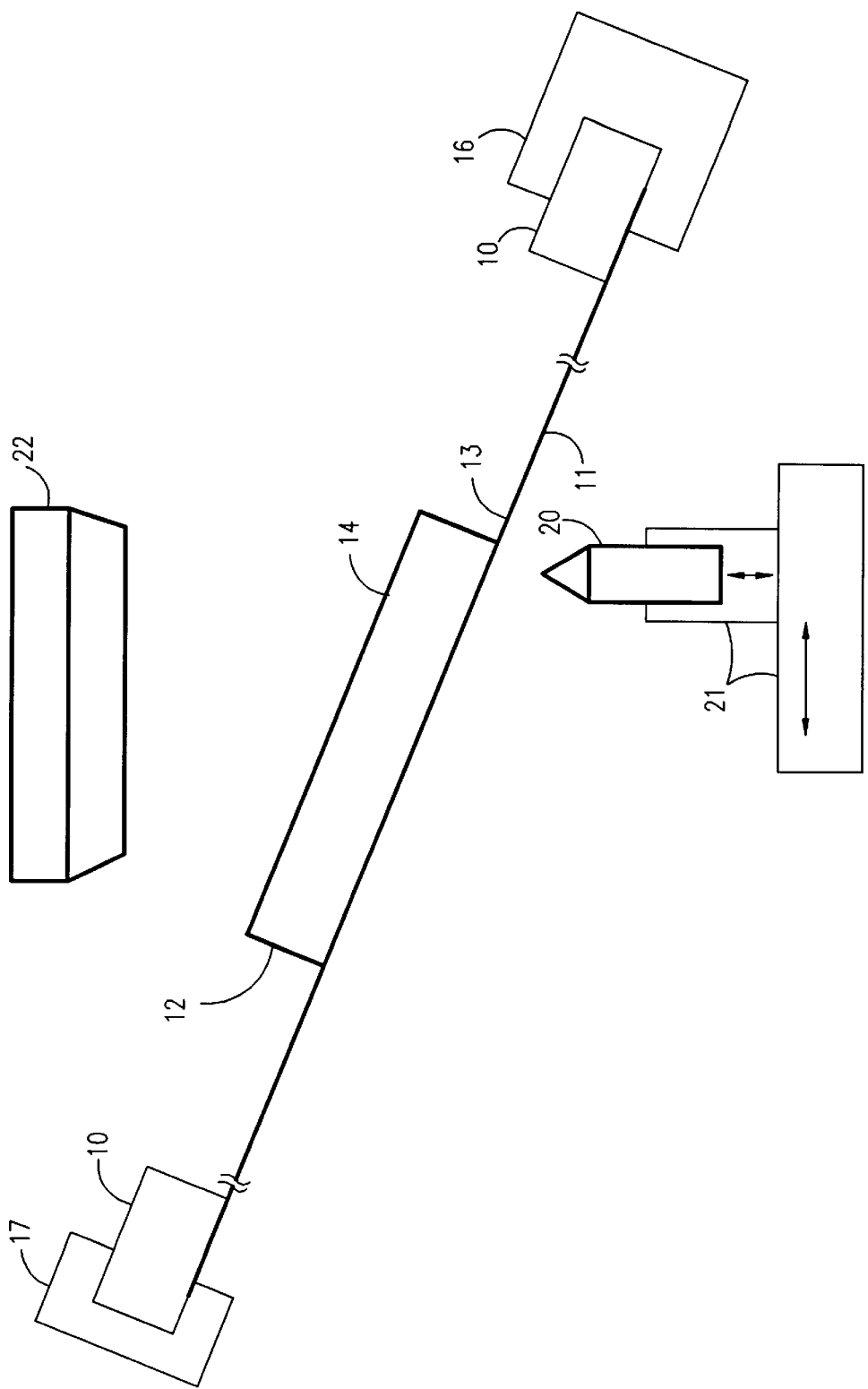
FIG. 2 is a diagrammatic representation of the separation tool of the present invention before engagement.

FIG. 2 illustrates an embodiment of a separation tool in accordance with the present invention for easily separating a slider 12 from the adhesive surface 13 of the tape 11 without puncturing the tape and without risking contamination of the slider with adhesive. The separation tool may be used during sorting to select the target die from the remaining die. Furthermore, the separation tool may selectively remove individual dice for sorting or processing, rather than an entire row or column of dice.

The frame 10 is mounted in a fixed position by support brackets 16 and 17, so that tape 11 lies in an approximate plane, held taut by the frame.

A pusher 20 is provided having a tip which is blunted or rounded to provide a surface area sufficient to prevent puncturing of the flexible membrane, or tape 11. The pusher 20 is movable in both the horizontal and vertical directions by a positioner 21. The positioner 21 may comprise a mechanical, hydraulic or electrical actuator which is bidirectional or tridirectional. A tridirectional positioner 21 is required to move the pusher 20 along a row to select an individual slider.

A picker 22, preferably a vacuum picker, is provided adjacent the slider 12 and has sufficient vacuum force to remove and hold the slider at the air bearing surface 14, but is still insufficient to pull the slider from the tape. Alternatively, a mechanical picker may be provided.

Figure 3:
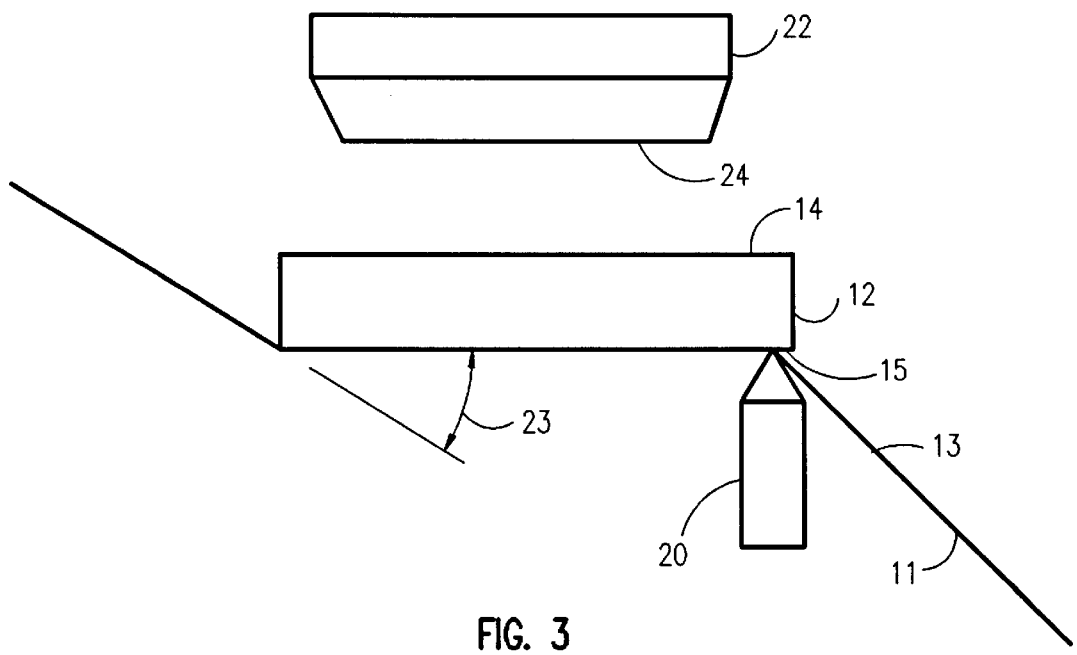
FIG. 3 is a diagrammatic representation of the separation tool of the present invention upon initial engagement.

FIG. 3 illustrates the initial engagement of the pusher 20 with the tape 11 and slider 12. The function of the separator tool of the present invention is to distribute the pulling force over time so as to use less power to deliver the same work in separating the tape 11 from the slider 12.

Specifically, the pusher 20 engages the tape 11 at or near the leading edge of the slider 12, or a plurality of pushers engage the tape at or near the leading edge of each slider in a row of sliders. The pusher projects into the plane of the tape 11 and of the slider, called a "first" plane, while the tape is held taut by the frame. Thus, the pusher supports the tape and the slider in a "second" plane at an angle 23 away from the angle of the first plane, with the tape now stretched as illustrated. The angle of the second plane brings the slider 12 parallel to the tip of the vacuum picker. As the slider 12 is held in the second plane, the picker 22 moves into engagement with the slider, such that an engagement surface 24 contacts the air bearing surface of the slider.

FIG. 3 illustrates the pusher 20 in an initial position with respect to the tape and slider at the leading edge of the slider. The sliders may be oriented on the tape so that either the deposited end or the "serial end" (with an etched serial number) of the sliders are at the leading edge.

Figure 4:
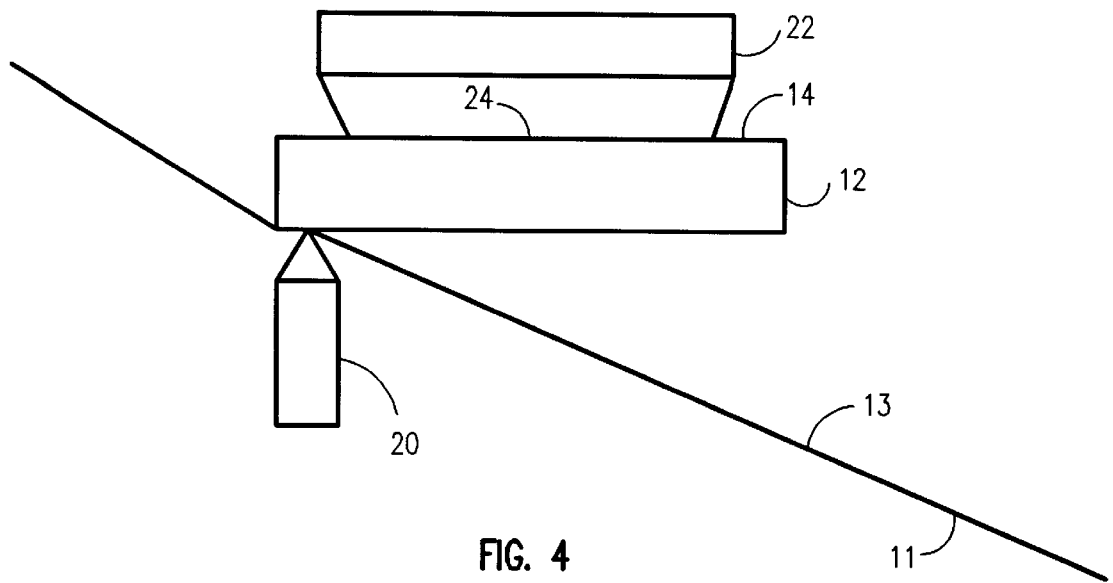
FIG. 4 is a diagrammatic representation of the separation tool of the present invention nearing completion of separation.

As illustrated by FIG. 4, the pusher 20 moves or slides along the tape 11 from the initial position near the leading edge of the slider toward a position at or near the trailing edge of the slider 12. As the pusher 20 slides along tape 11, the tension of the taut tape 11 as held in the frame progressively peels the adhesive surface 13 of tape 11 from the surface 15 of slider 12, thus distributing the pulling force over time. The tape 11 also peels away to the sides of the blunt pusher point.

Note that the work input necessary to remove a slider 12 from the tape membrane 11 is a discrete quantity of work defined as $$W = \frac{[M][D]}{[T]^2}$$

where M represents mass, D represent distance, and T represents time. Kinematically, work is defined as a function of power of $$P = \frac{[M][D^2]}{[T^3]}$$

multiplied by time T, or W=P·dT.

By incorporating the positioner 21 where the pusher tip 20 moves across the length of the slider 12, within the allotted time interval T (e.g., 1 second), the necessary power requirement P to remove the slider 12 is reduced from that of a faster, more instantaneous cycle to remove sliders, much like that of the conventional needle method. The method of the present invention preserves the integrity of the tape 11 and thereby eliminates or substantially reduces adhesive transfer from the tape 11 to the slider 12 as the slider 12 is removed from the tape 11.

Also, as the pusher 20 moves along the tape 11, the slider 12, attracted by the vacuum of the picker 22, is gradually released from the tape to become fully engaged with the picker 22 at surface 14.

Figure 5:
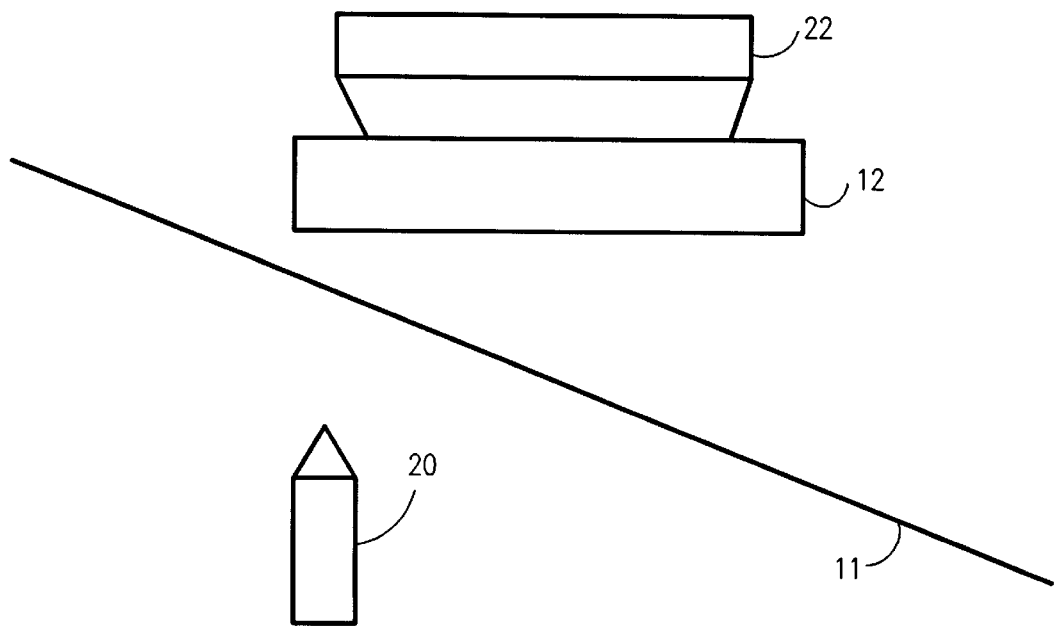
FIG. 5 is a diagrammatic representation of the separation tool of the present invention upon completion of separation of a slider from a wafer tape.

Thus, as illustrated in FIG. 5, the slider 12 is fully separated from the tape 11 and engaged and supported by the picker 22.

A plurality of sliders, up to a full row, may be separated from tape 11 by a corresponding row of pushers 20 aligned in the direction of the row of sliders. Thus, each pusher 20 projects through the plane of the tape at the leading edge of the corresponding slider.

Although a full row of sliders may be picked from the tape 11 at one time, the preferred embodiment is to pick only predetermined sliders during the sorting operation after the completion of cleaning and other processing. This allows sorting of the sliders as a last step to form target groups or to select certain sliders for rejection, without further processing or sorting.

The present invention localizes the pushing force applied to the tape making it easier to begin separation of the die from the tape. By moving the pushing device along the tape from the leading edge toward the trailing edge of the slider, the present invention distributes the work of separation over time, delivering the work as a peeling action. By not puncturing the tape, the slider is separated from the tape with less likelihood of contamination by the tape or adhesive.

While a preferred embodiment of the present invention has been illustrated in detail, it should be apparent that other embodiments and modifications and adaptations to those embodiments may occur to one skilled in the art without departing from the scope of the present invention as set forth in the following claims.

What is claimed is:

1. A method of removing a die from a tape using a pulling force from a picker, comprising the steps of:

a) extending said tape in a first plane, said tape having an adhesive surface that supports said die, said first plane at an acute angle to said picker held in a second plane;

b) applying a localized pushing force on a non-adhesive surface of said tape near a first end of said die such that the portion of said tape supporting said die extends into a plane parallel with said second plane;

c) moving said localized pushing force from said first end of said die toward a second end of said die to separate said die from said tape; and d) said picker providing said pulling force above said die during at least a portion of step (c) to remove said die from said tape.

2. The method of claim 1, wherein said applying step (b) comprises projecting a pushing device into said first plane of said tape.

3. The method of claim 2, wherein said extending step (a) additionally comprises holding said tape taut.

4. The method of claim 2, wherein said providing step (d) additionally comprises the step of:

(e) said picker engaging said die at the surface of said die opposite said tape.

5. The method of claim 4, wherein said moving step (c) comprises sliding said pushing device toward said second end of said die to cause said tape to peel completely from said engaged die to transfer said die to said picker.

6. The method of claim 5, wherein said engaging step (e) comprises vacuum picking said die with a vacuum picker.

7. The method of claim 1, wherein said die comprises a diced magnetic disk file slider.

8. A method for transferring at least one magnetic disk file slider of a diced row of sliders to a picker, said sliders having a suspension attachment surface and an air bearing surface opposite said attachment surface, comprising the steps of:

(a) providing said diced row of sliders adhesively mounted at said attachment surface on an adhesive tape;

(b) extending said tape in a first plane, said first plane at an acute angle to said picker held in a second plane;

(c) applying a localized pushing force on a non-adhesive surface of said tape near a leading edge of at least one slider of said mounted diced row of sliders, such that the portion of said tape mounting said at least one slider extends into a plane parallel with said second plane allowing said picker to engage said slider at said air bearing surface; and (d) moving said localized pushing force from said leading edge of said row of sliders in a direction perpendicular to said leading edge toward the trailing edge of said row of sliders to cause said supported tape to peel from said at least one of said mounted row of sliders to remove said row of sliders from said adhesive tape.

9. The method of claim 8, wherein said applying step (c) additionally comprises projecting a pushing device into said first plane of said tape.

10. The method of claim 9, wherein said applying step (c) comprises vacuum picking to engage said slider at said air bearing surface of said slider.

11. The method of claim 9, wherein said extending step (b) additionally comprises holding said tape taut and said applying step additionally comprises stretching said tape by said pushing device.

12. The method of claim 9, wherein said moving step (d) comprises sliding said pushing device toward and to said trailing edge of said at least one slider to cause said tape to peel completely from said engaged slider.

13. A tool for separating at least one die from a flexible tape to which said at least one die is adhesively mounted, comprising:

a tape support for extending said tape tautly in a first plane;

a picker positioned adjacent said tape in a second plane at an acute angle to said first plane for engaging said at least one die; and a pushing device projecting into said tape near a first end of said at least one die, extending said tape into a plane parallel with said second plane so said at least one die may be engaged by said picker, said pushing device movable from an initial position near said first end of said at least one die to a position toward an opposite edge of said at least one die so said tape peels from said at least one die to separate said die from said tape, so said at least one die may be separated from said tape by said picker.

14. The separating tool of claim 13, wherein said pushing device is movable the full length of said at least one die to fully peel and separate said die from said tape.

15. The separating tool of claim 13, wherein said picker comprises a vacuum picker.

16. The separating tool of claim 13, wherein said at least one die comprises a magnetic disk file slider mounted on said flexible membrane.

17. A tool for separating at least one of a diced row of magnetic disk file sliders from a tape to which said sliders are adhesively mounted, said sliders having a suspension attachment surface at which said sliders are mounted to said tape and an air bearing surface opposite said attachment surface, comprising:

a tape support for supporting said tape and said row of sliders in a first plane;

a picker positioned adjacent said mounted sliders, said picker having an engagement surface for engaging said at least one of said sliders at said air bearing surface, said engagement surface in a second plane at an acute angle to said first plane; and at least one pushing device extending near the leading edge of said at least one of said sliders, said tip projecting into said tape near the leading edge of said at least one of said sliders of said row of sliders at said attachment surface, extending said tape and said slider into a plane parallel to said picker engagement surface second plane so that said picker engages said sliders, said at least one pushing device movable from an initial position at said leading edge of said row of sliders in a direction perpendicular to said leading edge of said row of sliders to a position toward the trailing edge of said row of sliders, so that said movement of said at least one pushing device toward said trailing edge causes said tape support to peel said flexible tape from said sliders engaged by said picker for separating said sliders from said adhesive tape.

18. The separating tool of claim 17, wherein said at least one pushing device is movable the full length of said sliders to fully peel and separate said sliders from said tape.

19. The separating tool of claim 17, wherein said picker comprises a vacuum picker.

* * * * *